United States Patent
Bartoli et al.

(10) Patent No.: US 8,599,615 B2
(45) Date of Patent: Dec. 3, 2013

(54) MEMORY DEVICE IN PARTICULAR EXTRA ARRAY CONFIGURED THEREIN FOR CONFIGURATION AND REDUNDANCY INFORMATION

(75) Inventors: Simone Bartoli, Mandello del Lario (IT); Mauro Pagliato, Bollate (IT); Diego Della Mina, Colle Brianza (IT)

(73) Assignee: Elpida Memory, Inc., Tokyo (JP)

( * ) Notice: Subject to any disclaimer, the term of this patent is extended or adjusted under 35 U.S.C. 154(b) by 0 days.

(21) Appl. No.: 13/275,708

(22) Filed: Oct. 18, 2011

(65) Prior Publication Data

US 2013/0094295 A1    Apr. 18, 2013

(51) Int. Cl.
*G11C 11/04* (2006.01)
*G11C 16/06* (2006.01)

(52) U.S. Cl.
USPC ............ 365/185.17; 365/185.09; 365/185.21; 365/185.22; 365/185.05

(58) Field of Classification Search
USPC .................. 365/200, 185.09, 185.17, 185.21, 365/185.22, 185.05
See application file for complete search history.

(56) References Cited

U.S. PATENT DOCUMENTS

| | | | | |
|---|---|---|---|---|
| 7,236,397 B2* | 6/2007 | Kim | ........................ | 365/185.09 |
| 7,315,472 B2* | 1/2008 | Lee | ........................ | 365/185.17 |
| 7,515,472 B2* | 4/2009 | Chung | .................... | 365/185.21 |
| 7,706,184 B2* | 4/2010 | Hamada | ................... | 365/185.12 |
| 2007/0115724 A1* | 5/2007 | Hwang | ..................... | 365/185.17 |
| 2010/0165765 A1* | 7/2010 | Yu et al. | ........................ | 365/200 |
| 2011/0216602 A1* | 9/2011 | Kim et al. | ................ | 365/185.22 |
| 2012/0057419 A1* | 3/2012 | Kim | ............................. | 365/200 |

* cited by examiner

*Primary Examiner* — Hoai V Ho
*Assistant Examiner* — Tri Hoang
(74) *Attorney, Agent, or Firm* — Morrison & Foerster LLP

(57) ABSTRACT

Disclosed herein is a device that includes a plurality of first word lines each extending from an associated one of the first terminals in a second direction toward to the second terminals and terminating between the first and second terminals, the second direction being substantially perpendicular to the first direction, and a plurality of second word lines each extending from an associated one of the second terminals in a third direction toward to the first terminals and terminating near to an end of an associated one of the first word lines, the third direction being opposite to the second direction, each of the second word lines being substantially aligned with an associated one of the first word lines.

25 Claims, 8 Drawing Sheets

MEMORY DEVICE IN PARTICULAR EXTRA ARRAY CONFIGURED THEREIN FOR CONFIGURATION AND REDUNDANCY INFORMATION

FIELD OF THE INVENTION

The present disclosure relates to a memory device, and more particularly to an extra array configured therein for configuration and redundancy information.

The disclosure particularly, but not exclusively, relates to a NAND memory device with a dedicated sensing circuitry for configuration and redundancy information, and the following description is made with reference to this field of application for convenience of explanation only.

BACKGROUND OF THE INVENTION

In the last years the memory market has been characterized by an increasing interest in high density devices and technology scaling has become more and more aggressive, both for memory core and circuitry, especially for the flash memory devices. While the technology is continuously improving to reduce the memory size, new solutions are studied to reduce the area of the related analog circuitry, which is not exclusively dependent on technology, but mainly on the specifically adopted layouts and architectures.

Redundancy and configuration information is extremely important for the correct working of a flash memory device. Both redundancy and configuration information are stored into the memory device during the test process of the flash memory device, prior to selling the device to an end user. Redundancy information does not need to be updated after it is stored at the end of the manufacturing process of the flash memory device, while configuration information needs to be updated into new data.

More in particular, redundancy information is used by the circuitry of the device to repair internal array defectiveness. For example, redundancy information is essentially composed by the addresses of the failed strings which are to be substituted by other strings that have been added to the matrix for this purpose.

Configuration information is used by the circuitry to define the value of important parameters used for the correct working of the circuitry itself. For example, configuration information relates to all circuit portions, both the analog portion and the digital portion, the current and voltage references, the power-on circuitry, all the regulators, the output values from the pumps, the clock frequencies of the oscillator, the inner algorithms, the output buffers and additional branches that can be connected or not to the configurations. Generally, during the design phase, it is usual to configure the circuits assuming it can happen that the silicon would function in a different way with respect to the behavior having been simulated by using reference models.

Next, a conventional way to store such information in flash memory devices is to use particular structures called "fuses". The information is written into the fuses by means of high currents that destroy the structure of the fuses themselves. A destroyed fuse conventionally corresponds to a logical "1", while a non-destroyed fuse conventionally corresponds to a logical "0". The fuse structures may store both the redundancy and configuration information.

However, in the convention way, the disadvantage in using fuses is that fuses are big structures and so a huge area is concerned. Moreover, the fuse needs to be destroyed when information is written therein, and the destroyed fuses cannot be repaired, therefore, once the information is stored in the fuse, it cannot be changed anymore.

Another conventional way to store redundancy and configuration information is to use memory cells in the array of the flash memory device. The cells share the sensing circuit with the other cells of the array. This way is more efficient in terms of area occupation than the above-mentioned convention way, and allows also changing the stored information by means of an erase operation.

However, in another conventional way, provided that the redundancy information is stored in the array of the flash memory device, until the array is accessed for read, such a redundancy information is thus not available. As a consequence, the reading of the redundancy information is obviously performed without knowing the redundancy information or adopting redundant technique. Therefore, such a read operation is difficult or could not be performed without an error. In this case, complex error correction algorithms have to be used, which made the read operation more complicated.

Another problem of this conventional way is that after the read operation the information has to be stored in an array of latches. This is because the redundancy and configuration information has to be ready for all the subsequent operations, and also because the sensing circuitry, that is shared with the memory array, should be kept free to read data from the memory array.

Still another problem of this conventional way, redundancy and configuration information has a different characteristic, that is, the redundancy information is not erased but only read, once after written in the flash memory, while the configuration information may be changed. Provided that the redundancy and configuration information are stored in a common erasing area such as block or sector of the flash memory device, the redundancy information is erased unnecessarily when the configuration information is erased.

With regard to reading correctly information such as redundant and configuration without an error, since the redundancy and configuration information need to be ready at the end of the power on phase of the flash memory device, the read operations for the redundancy and configuration information need to be performed before the end of the power-on phase. In this power-on phase of the device, if the voltage supply is not well controlled, the information is not correctly read out from the array. In general, since voltage supply to be used during the power-on phase in the device is ramping up, the read operation during this phase is difficult to be controlled well, therefore information is difficult to be read correctly without an error during this phase. Furthermore, the voltage ramp during the power-on phase depends on the device in which the flash memory device is used. For example, the device could be a USB portable storage device, a cellular phone, an electronic board, and the like. In each of such devices, the speed sloping, the presence or absence of glitches, the final value, the presence or not of intermediate plateau, and the like are different. This also makes the difficulty to control the voltage ramp well and to read information correctly without an error during the phase.

SUMMARY OF THE INVENTION

According to an aspect of the present invention, there is provided a device that includes a first decoder circuit including a plurality of first output nodes and producing a plurality of first decoded voltages at the first output nodes, respectively, a second decoder including a plurality of second output nodes and producing a plurality of second decoded voltages at the second output nodes, respectively, a plurality of first terminals coupled to the first output nodes to receive the first decoded voltages, respectively, the first terminals being arranged in line in a first direction, a plurality of second terminals coupled to the second output nodes to receive the second decoded voltages, respectively, the second terminals being arranged in line in the first direction, a plurality of first word lines each extending from an associated one of the first terminals in a second direction toward to the second terminals and terminating between the first and second terminals, the second direction being substantially perpendicular to the first direction, a plurality of second word lines each extending from an associated one of the second terminals in a third direction toward to the first terminals and terminating near to an end of an associated one of the first word lines, the third direction being opposite to the second direction, each of the second word lines being substantially aligned with an associated one of the first word lines, a plurality of bit lines each arranged to intersect with the first word lines, and a plurality of second bit lines each arranged to intersect with the second word lines. A first memory array including a plurality of cells, word lines and bit lines, the word lines including first and second word lines positioned on a first line extending straight from a first direction to a second direction and separated from each other, the first word line configured to receive a voltage from the first direction to the second direction, and the second word line configured to receive a voltage from the second direction to the first direction.

According to another aspect of the present invention, there is provided a device that includes a first array comprising a plurality of cells, a plurality of word lines, a row decoder circuit, and a row connecting line extending from the row decoder circuit and branching to reach ones of the word lines of the first memory array, such that when the row connecting line is selected, the ones of the word lines are selected According to still another aspect of the present invention, there is provided a device that includes a first array including a plurality of cells, a plurality of bit lines, a select transistor having a first node, and a first line extending from the first node of the select transistor and branching to reach ones of the bit lines, such that when the first line is selected, the ones of the bit lines are selected.

BRIEF DESCRIPTION OF THE DRAWINGS

The characteristics and advantages of the memory device, apparatus and method according to the disclosure will be apparent from the following description of embodiments thereof given by way of indicative and non limiting example with reference to the annexed drawings, in which FIG. 1 schematically shows an exemplary structure of a memory and a memory controller.

DETAILED DESCRIPTION OF THE EMBODIMENTS

The present disclosure makes reference to a flash memory device, by way of example, NAND type flash memory, comprising an extra memory array for storing redundancy information and/or configuration information, and a sensing circuit for accessing data stored in the extra memory array.

Figure 1:
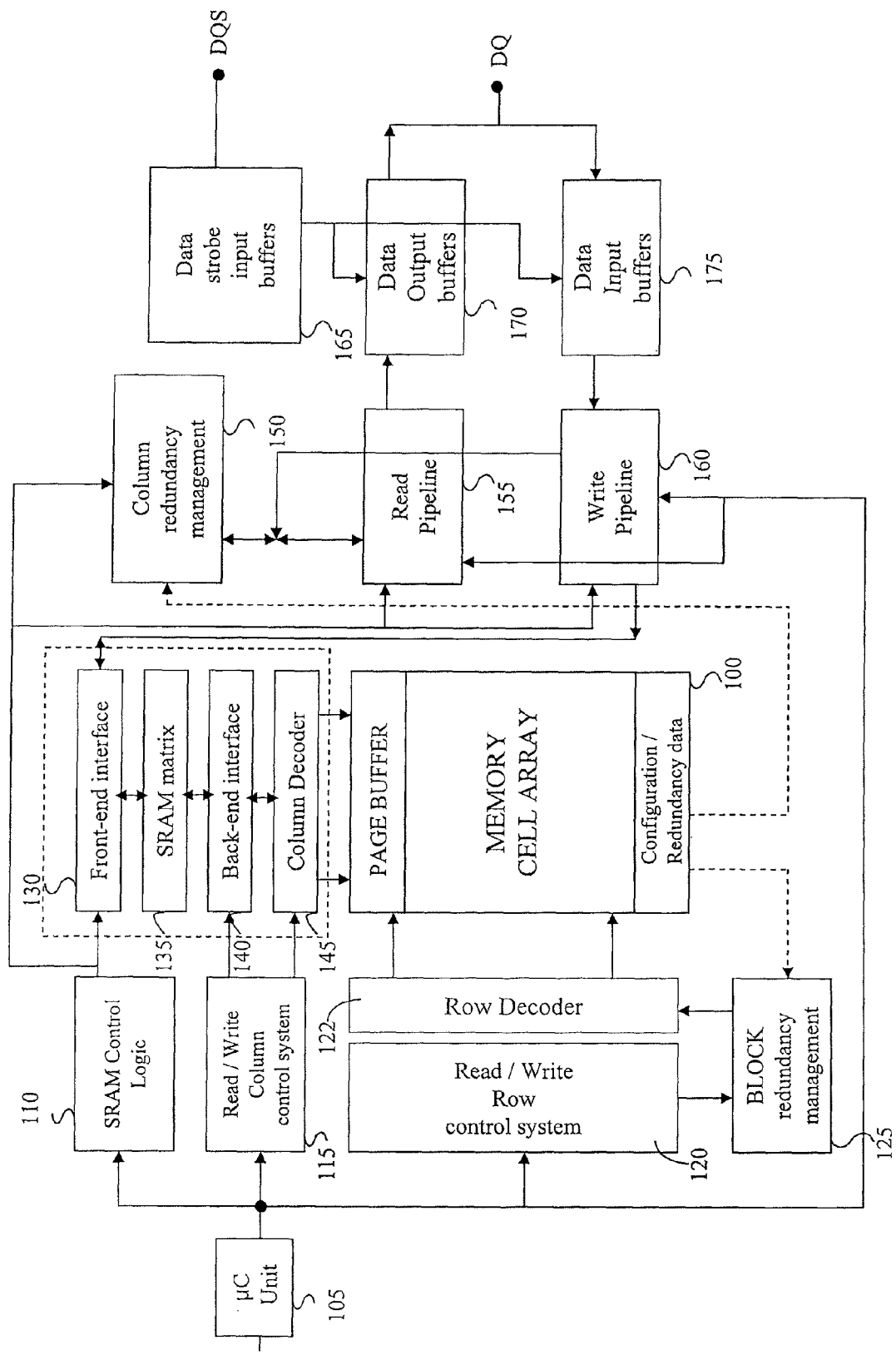

FIG. 1 schematically shows an exemplary structure of a memory and a memory controller.

A Micro-Controller Unit 105 controls an SRAM matrix 135 and/or a Flash memory 100. SRAM Control Logic 110 and Read/Write Column control system 115 are units for controlling the SRAM matrix 135. The Micro-Controller Unit 105 sends a signal to control the SRAM Control Logic 110 and the Read/Write Column control system 115, then the SRAM Control Logic 110 accesses a Front-end interface 130 and the Read/Write Column control system 115 accesses a Back-end interface 140 to control the SRAM matrix 135. The Read/Write Column control system 115 is also connected to a Column Decoder 145 for decoding which column of the flash memory 100 it accesses. The Read/Write Row control system 115 is accessed by the Micro-Controller Unit 105 for decoding row information.

A Row Decoder 122 and a Read/Write Row control system 120 are also connected to the flash memory 100 as well to a logic for block redundancy management 125. The SRAM Control Logic 110 is also connected to a logic for column management 150, a Read Pipeline 155 and a Write Pipeline 160, the latter being also connected to the Front-end interface 130 and accessed by Data Input buffers 175, while Data output buffer 170 are connected to the Read Pipeline 155. Data strobe input buffers 165 are connected to the Data Input buffers 175 and to Data output buffer 170, as well as a DSQ terminal, a DQ terminal being connected to the Data Input buffers 175 and Data output buffer 170. In particular, the logic for block redundancy management 125 and the logic for column management 150 use the redundancy information in order to manage the operation of the array of the memory device.

The flash memory 100, for example, may comprise page buffer, memory cell array, and configuration/redundancy data. Specific address in the flash memory 100 can be access by using the Row Decoder 122 and the Column Decoder 145. The data stored in the flash memory 100 may be read by the SRAM matrix 135. Reversely, the data stored in the SRAM matrix 135 may be written into a location of the flash memory 100.

Flash memory is a non-volatile computer storage chip that can be electrically erased and reprogrammed. Flash memory includes a plurality of cells, and each cell is made, for example, by a floating gate transistor. Alternatively, each cell can be made by a cell transistor comprising charge-trapping region. Each memory cell may store only one bit of information, or may store more than one bit in case of the known multi-level cell (MLC) devices. For the multi-level cell, the level of voltage stored in the cell may be quantized, and represents different information based on the voltage level of the cell. On the contrary, for single-level memory cell, there exist only two states, i.e. 0 or 1 per each memory cell.

In an example when a floating gate transistor is used for each cell of the flash memory, each memory cell resembles a standard MOSFET, except the transistor has two gates instead of one. On top, there is a control gate as in other MOS transistors, but below this there is a floating gate being insulated all around by an oxide layer. By confining or releasing electron in the floating gate, the flash memory may store information for a long time without losses, due to the structure of the floating gate and control gate, i.e. the insulated floating gate. However, this specific structure for floating gate is mere an example to explain an embodiment of the invention, and does not limit the scope of the invention. Other type of transistor or electronic component may be used for memory cell instead of the floating gate MOS transistor.

To erase a flash cell, i.e. resetting it to the "1" state, a large voltage of the opposite polarity is applied between the control gate and source terminals, pulling the electrons off the floating gate through quantum tunneling. This erasing operation may be usually performed on a block-wise basis, that is to say, all the cells in an erase segment are erased together.

A single-level flash cell in its default state are logically equivalent to a logical "1" value, because current will flow through the channel under application of an appropriate voltage to the control gate. In NOR type memory, a flash cell can be programmed, or set to a binary "0" value by applying an elevated on-voltage to its control gate and flowing electrons from the source to the drain assuming an NMOS transistor. If the current between source and drain is sufficiently high, some high energy electrons may jump through the insulating layer onto the floating gate, via a process called hot-electron injection. Generally, the program operation may be done by a byte or word basis. Alternatively, for NAND type flash memory, the program operation may be done by a page basis. Therefore, when information is read or programmed in a flash memory, it may be done in a random access fashion, whereas the erase operation is done by a block basis.

Figure 2:
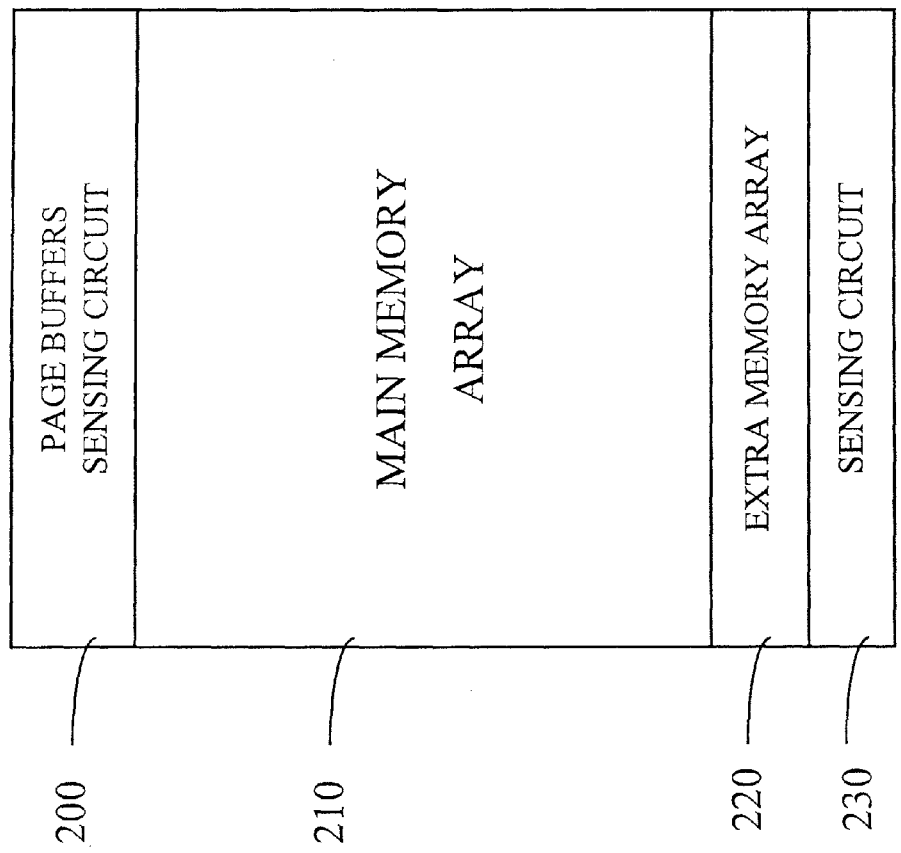
FIG. 2 schematically shows a flash memory according to an embodiment of the invention.

FIG. 2 schematically shows a conceptual structure of a flash memory according to an embodiment of the invention. Flash memory 100 in FIG. 1 corresponds to that in FIG. 2. The components except for the flash memory 100 in FIG. 1 are not shown in FIG. 2 to omit descriptions thereof.

The flash memory 100 comprises page buffers 200, a main memory array 210, an extra memory array 220, and a sensing circuit 230. In particular, the main memory array 210 may comprise a plurality of memory cells, a plurality of word lines operatively coupled to at least one of the plurality of memory cells, and a plurality of bit lines operatively coupled to at least one of the plurality of memory cells. The page buffers 200 may be located at a side of the main memory array 210, and the sensing circuit 230 may located at the opposite side of the main memory array 210, the extra memory array 220 being located between the main memory array 210 and the sensing circuit 230.

The page buffers 200 are coupled to at least one of the plurality of bit lines extended from the main memory array 210. Page buffer 200 are used to buffer data from the main memory array 210 in order to read data from the main memory array 210, so this page buffer 200 may be considered as a sensing circuit of the main memory array 210. Moreover, data to be stored in the flash memory 100 may also be inputted by the page buffers 200. Page buffer 200 is a sort of buffer, so it can store information temporarily. Page buffer may be named as a main sensing circuit, or function as a part of the main sensing circuit which may read or write data of the main memory array 210.

The extra memory array 220 may comprise a plurality of memory cells, a plurality of word lines operatively coupled to at least one of the plurality of memory cells, and a plurality of bit lines operatively coupled to at least one of the plurality of memory cells. The sensing circuit 230 may be coupled to at least one of the plurality of bit lines of the extra memory array 220 for accessing data stored in the extra memory array 220.

The extra memory array 220 may store redundancy information and/or configuration information. The redundancy information and/or configuration information is used for correct working of the flash memory 100.

Basically, the cells in the extra memory array 220 and the cells in the main memory array 210 are physically separated and, the sensing circuit 230 is dedicated to the extra memory array 220. The sensing circuit 230 may be made simpler with respect to the main array sensing circuitry, i.e. the page buffer 200 in the embodiment. This is because the sensing circuit 230 is separated from the page buffer 200, and operates to access data in the extra memory array 220. The data stored in the extra memory array 220, for example, configuration data and redundancy data, have different characteristics from the data stored in the main memory, many tricks to simplify the design of the sensing circuit 230 may be used.

Advantageously, due to the architecture of the embodiment, the read operation of the information is much less critical than the normal array read operation and for this reason it is safe to perform this read operation even during the power on phase of the memory device when the redundancy information is not ready.

The fact that the extra memory array 220 is separated from the main memory array 210 allows adopting architectural configuration to minimize errors in the reading operation during the power on phase. Moreover, the sensing circuit 230 can be used to read and store the information during all the subsequent operations, since the sensing circuit 230 is separated from the normal sensing circuitry (page buffers 200) used for reading the main memory array. That is, the sensing circuit 230 need not to be cleared when data in the main memory array 210 should be extracted; page buffer 200 can process the data. Being the two arrays separated one another, different architectures may be used for the arrays, in particular, for the extra array 220 in order to minimize the error probability when reading the extra array during the power on.

More features and characteristics will be explained with a more detailed and specific figure.

Figure 3:
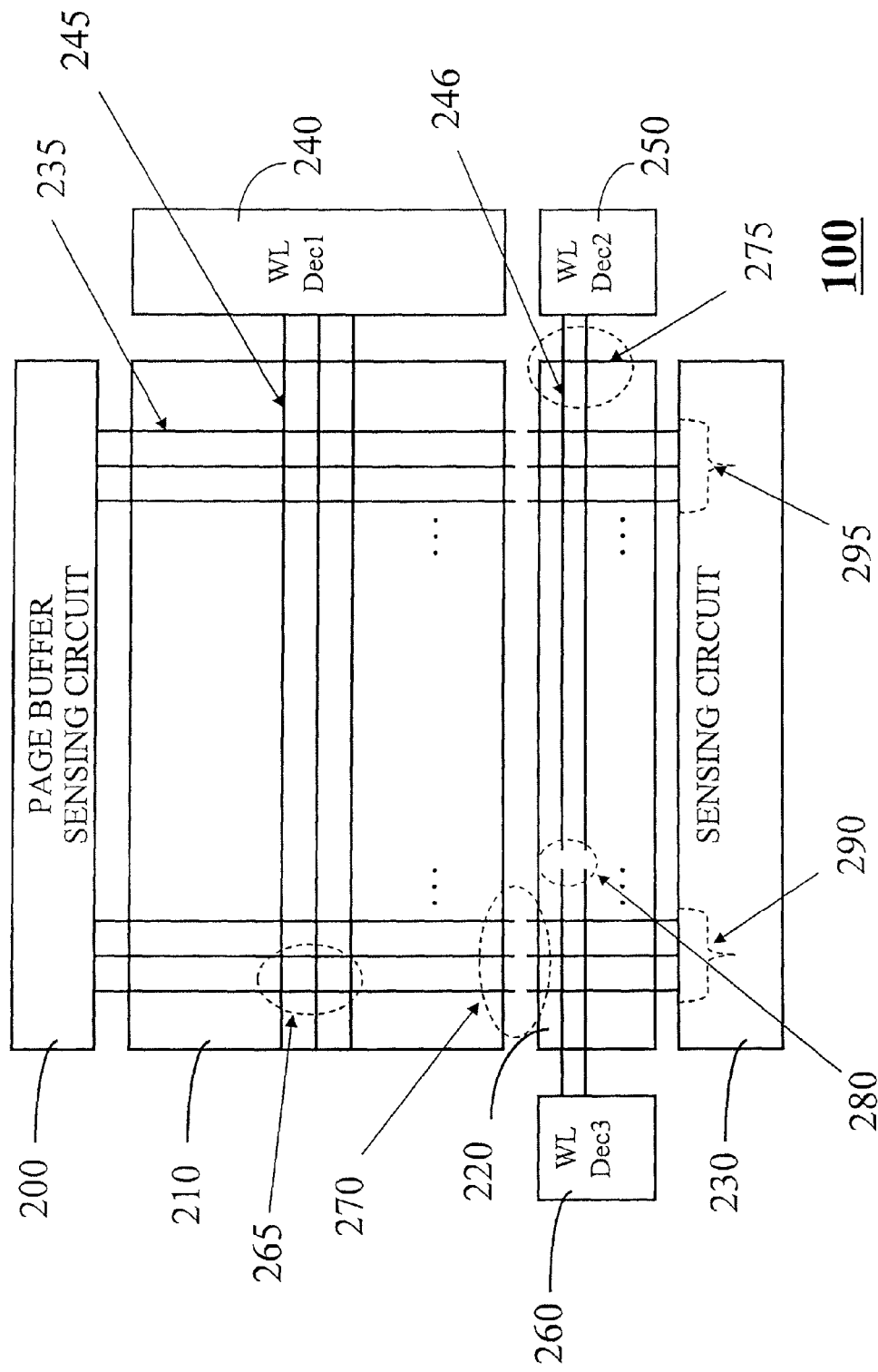
FIG. 3 schematically shows a detailed structure of the flash memory of the embodiment shown in FIG. 2.

FIG. 3 shows a more detailed structure of the flash memory 100 schematically shown in FIG. 2. Word line decoders 240, 250, 260 that are not shown in FIG. 2 are shown in FIG. 3 to be further explained.

The flash memory 100 comprises page buffers 200, a main memory array 210, an extra memory array 220, and a sensing circuit 230.

Moreover, the flash memory 100 comprises a first sub unit of word-line decoder 240 for decoding an address for a cell in the main memory array 210. The first sub unit of word-line decoder 240 may receive a control and address signal from another control unit outside, and decode its input to select an appropriate block, page, and/or cell, and apply a voltage to a specific word-line. The memory cells selected by the word-line may be accessed by the page buffers 200, and erased, programmed, or read.

The main memory array 210 and the extra memory array 220 include a plurality of bit lines 235, and a plurality of word lines 245. Commonly, word lines are depicted horizontally, and bit lines are depicted vertically, and the conventional notation will be followed throughout the specification. However, this does not necessarily limit the direction of the bit-line and/or word-line.

Commonly, the word-line 245 is connected to the control gate of the memory cell if a transistor is used as a memory cell. Bit-line 235 is connected to the source or drain of the transistor. Through a word-line 245, a number of cells of specific addresses may be accessed. The Bit-line 235 allows a controller to read or write a data at the cell.

As seen at a location 270 in FIG. 3, a plurality of bit lines between the main memory array 210 and the extra memory array 220 is cut to separate the main memory array 210 and the extra memory array 220. Since the bit-line is cut, no current or voltage generated in the main memory array 210 can flow to the extra memory array 220 and thus to the sensing circuit 230. Moreover, no current or voltage generated in the extra memory array 220 can flow through the main memory array 210 to the page buffers 200. Therefore, the read/write operations for both arrays can be separated. In other words, by cutting the bit lines, the sensing operation performed by the sensing circuit 230 may be independent from the sensing operation done by the page buffers 200.

However, the embodiment does not necessarily limit the invention so that all of the bit-lines between the main memory array 210 and the extra memory array 230 should be cut. In some case, there can be some auxiliary bit-lines which are not cut but do not influence the function of the present invention. The invention does cover this modification. Moreover, the line cutting process can be done by a various well-known method in the semiconductor manufacture process.

As seen at a location 280 in FIG. 3, the plurality of word-lines in the extra memory array 280 is cut to separate a block for redundancy information and a block for configuration information. For example, the redundancy information is stored in the left plane of the extra memory block 220, and can be read or written through the left side bit lines 290. Alternatively, the configuration information is stored in the right plane of the extra memory block 220, and can be read or written through the right side bit lines 295. If we assume the redundancy information is stored in a first portion associated with the left side bit lines 290, the configuration information may be stored in a second portion associated with the right side bit lines 295 and may be read or written through the right side bit lines 295.

The flash memory 100 further comprise a second sub unit of the word line decoder 250 which is connected to the first portion of the plurality of word lines, and a third sub unit of the word line decoder 260 which is connected to the second portion of the plurality of word lines.

Provided that the configuration information and the redundancy information are stored respectively in the right and the left sides of the extra memory array 220 as explained above, the second word line decoder 250 is used to access the stored configuration information and the third word line decoder 260 is used to access redundancy information. Therefore, the redundancy information can be accessed separately from the configuration information in the read, write and erase operations.

Especially, the erase operation can be applied to only the configuration information, thereby avoiding unnecessary erase operation over the redundancy information. As one of the erase operations which can be used in non-volatile memory cells, an erase operation may be done by putting a positive voltage to a source line connected with the source of a cell transistor and a negative voltage to the word-line which is connected to the gate of a cell transistor. As another erase operation, it may be done by applying high voltage to a well associated in common with the right and left portions of the extra array, applying ground voltage or low voltage to the selected word lines, for example in the right portion, and applying bias voltage to the unselected word lines, for in the left portion. In both of the erase operations, since the word lines 246 of the extra memory array 220 are cut, each portion for configuration information and redundancy information can be separately erased from each other.

The first sub unit 240, the second sub unit 250, and the third sub unit 260 of the word line decoder may reside physically in the row decoder 122 in FIG. 1. Alternatively, the NAND memory may comprise only one row decoder 122 which perform all functions done by the first sub unit 240, the second sub unit 250, and the third sub unit 260. That is to say, the row decoder does not necessarily comprise sub unit.

This can save time during a test phase when it is possible to erase configuration information without the need to restore the redundancy information Moreover, instead of using two separate decoders, two sub units of the word-line decoder 250, 260 may also be implemented in a single decode unit which would occupy a same area that the two sub-units of the word-line decoders 250, 260. Furthermore, the two sub-units of the word-line decoders 250, 260 may also be implemented in a same portion of the memory device comprising the first sub unit of the word-line decoder 240 of the main memory array 210.

Instead of cutting the word line as 280 to separate the extra memory block 220 into two parts as the embodiment, using separate wells might be consider to separate the extra memory block 220. Particularly, this can be accomplished by applying high voltage to the well of portions of an array, applying ground potential to the gates of the cells of one portion thereof, and biasing high-voltage to gates of the cells of the other portion for erase inhibit condition. That is to say, if well of the one portion of the array is separated by that of the other portion thereof, those portions can be separately erased. However, separating the wells is an operation having a high cost in terms of area and also it could be forbidden by the used technology.

Hereinafter, a detailed structure for cells and strings 265 of main memory array 210 and cells and strings 275 of extra memory array 230 will be explained.

Figure 4A:
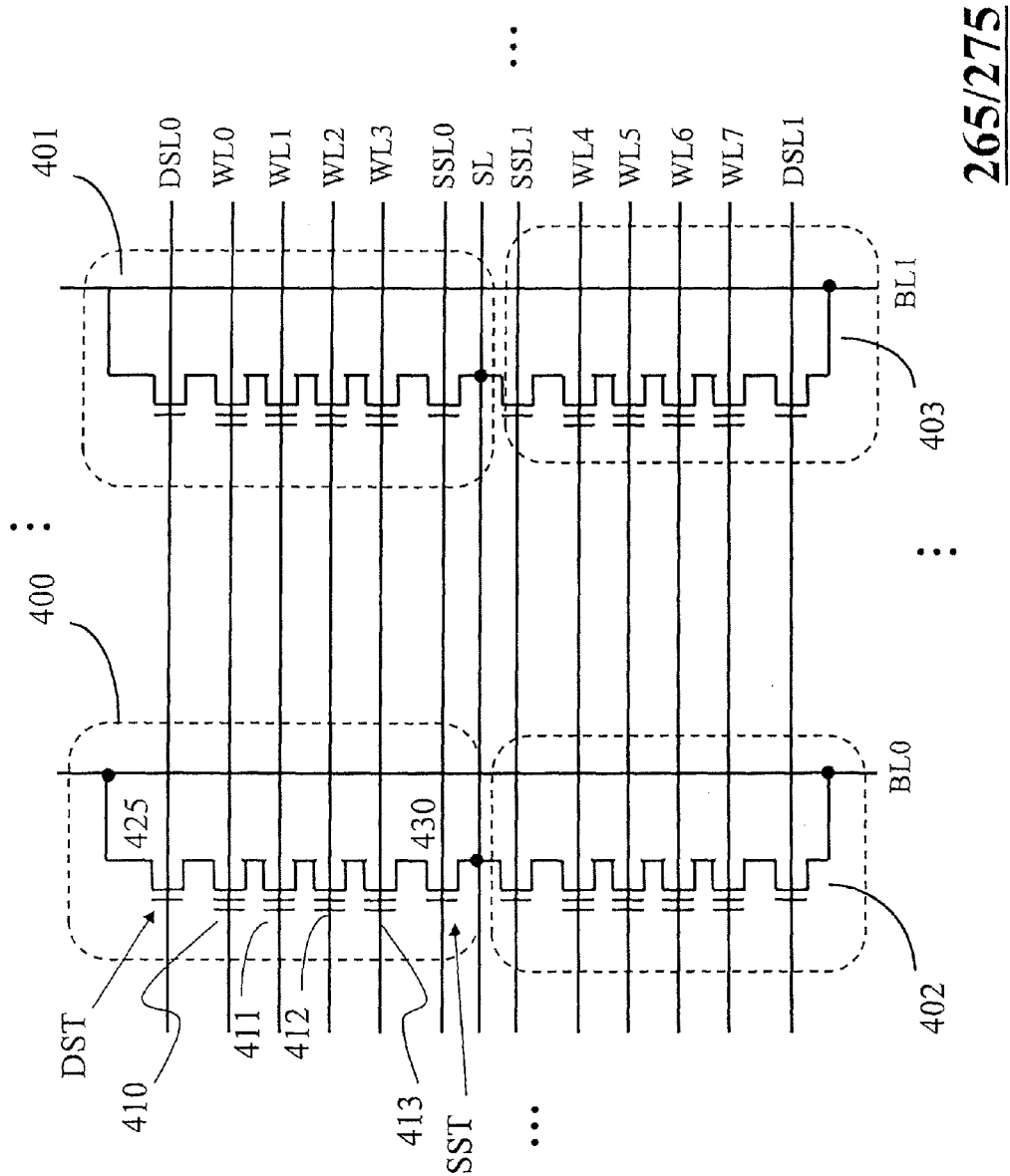
FIG. 4A schematically shows a detailed structure for memory cell and string of the extra memory array of FIG. 3.

FIG. 4A schematically shows a detailed structure for memory cell and string of the extra memory array 230 of FIG. 3 according to the embodiment. The main memory array 210 may have memory cell and string 265 with a similar structure of the cells and string 275 of the extra memory array 230 according to the embodiment.

A NAND memory array is usually organized in blocks. A block is the smallest part of the array that can be erased at once. A block comprises a predetermined number of strings 400, 401. This number depends on the dimension of a page indicated in the specifications of the memory device. The string 400 is composed by a predetermined number of memory cells 410 connected in series. This number depends on the process used to manufacture the memory device. Each string 400 is connected to a bit-line BL0 through a selector cell or DST 425 and to a common source line SL through another selector cell or SST 430. For example, a first string 400 and a third string 402 are coupled to a bit-line BL0, and to the common source line SL. Thus, they are sharing source and bit-lines. Moreover, a second string 401 and a fourth string 403 are coupled to a bit-line BL1, and to the common source line SL, so they are also sharing source and bit-lines.

FIG. 4A depicted four strings 400, 401, 402, and 403, connected to two bit-lines BL0 and BL1. For the first string 400, the DST 425, i.e. the drain select, is the selector cell that connects the string 400 to the bit-line BL0. Usually, the DST 425 may be MOSFET and may have a drain connected to the bit-line BL0. Alternatively, it is also possible to connect the source of the memory cell realized by transistors to the bit-lines in case of other type of memory device. The specific configuration of the memory cells and bit lines does not limit the scope of the invention. The gate of the DST 425 is connected to a drain selection line DSL0 so that a voltage thereon may switch the DST 425.

Moreover, the SST 430, i.e. source select, is the selector cell that connects the string to the common source line SL. The gate of the SST 430 is connected to a source selection line SSL0 so that a voltage thereon may switch the SST 430.

Each string may be activating by controlling signal applied to the selection lines DSL and SSL. By closing the selector cells (transistors) 425, 430, the first string 400 may be electrically conducted to the bit-line BL0, and may supply its current to bit-line BL0 or pull current from it based on the information stored in the memory cells 410, e.g. the electron trapped in its floating gate or its charge-trapping region.

To describe the structure of the first string 400 more in detail, the DST 425 is connected a first memory cell 410. A second memory cell 411, a third memory cell 412, and a fourth memory cell 413 are connected to each other series. In other words, the drain of the first memory cell 410 is connected to the source of the DST 425, the drain of the second memory cell 411 is connected to the source of the first memory cell 410. Similarly, the drain of the third memory cell 412 is connected to the source of the second memory cell 411, and the drain of the fourth memory cell 413 is connected to the source of the third memory cell 412. The drain of the SST 430 is connected to the source of the fourth memory cell 413.

The gate of each the memory cell is connected to the corresponding word line, e.g. WL0, WL1, WL2, WL3. Since several memory cells 410, 411, 412, 413 in a string 400 are connected in series, only if all word lines WL0, WL1, WL2, WL3 are pulled high, i.e. above the threshold voltage of the transistors, then the bit line BL0 connected to these memory cells is pulled low.

Therefore, to read a data stored in a specific memory cell, e.g. a memory cell 411, word lines WL0, WL2, WL3 except WL1 are controlled to be pulled up far above the threshold voltage, while the word line WL1 is controlled to be pulled up just over the threshold voltage, when the SST and DST are switched to make inner cells to conduct to the bit line BL0. Regardless of the bit stored in the memory cells 410, 412, 413, specifically a data bit stored in the gate of the memory cell, the memory cells 410, 412, 413 are conducted by the high voltage applied thereto. For the memory cell 411, because a voltage just over the threshold voltage is applied to the control gate of the memory cell 411, if an electron is trapped in the gate of the memory cell 411, the voltage of the control gate is cancelled or partially screened by the trapped electron, thereby the drain and source of the memory cell 411 are open, and no current flows through the chain of the first string 400. Alternatively, if there is no trapped electron, the memory cell 411 will conduct, then current may flow through the first string 400. In this way, the current flowing from bit-line to source or from source to bit-line may be controlled, and by sensing the amount of the flowing current the read operation may be performed. This is a typical operation of a NAND type flash memory.

Figure 4B:
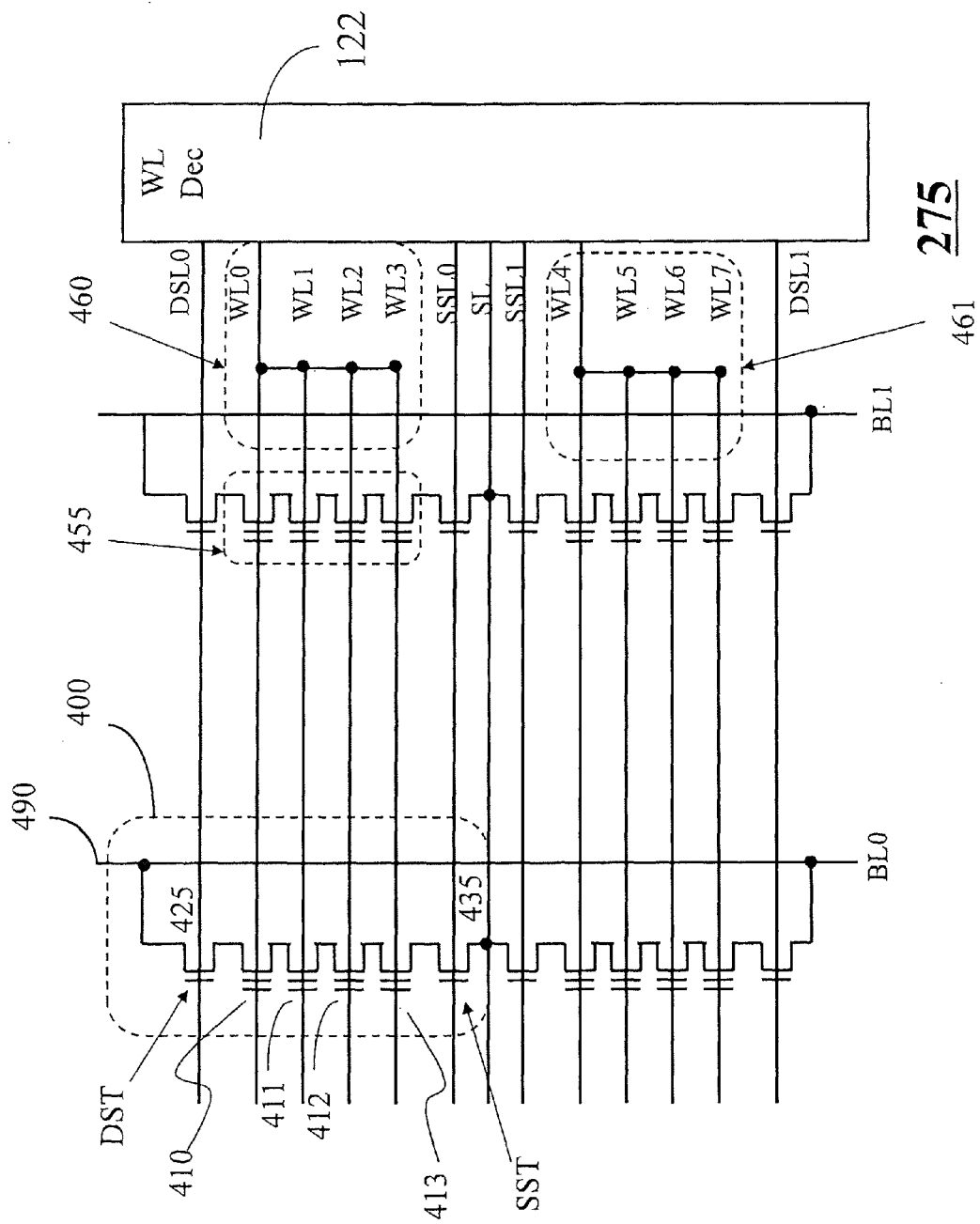
FIG. 4B schematically shows a detailed structure for memory cell and string of the extra memory array of FIG. 3 according to another embodiment of the invention.

FIG. 4B schematically shows a detailed structure of memory cell and string of the extra memory array 230 of FIG. 3 according to another embodiment. Differently from FIG. 4A, row or word line decoder 122 is shown in FIG. 4B to be further explained.

The structure of the memory cells of the extra memory array 230 may be same or substantially same to those of the main memory array 210, since both arrays may be manufactured in a same process. However, because the extra memory array 230 has to be accessed for example during the power-up phase, it should guarantee reliability to read data correctly without an error from the extra array.

For this purpose, in the extra array shown in FIG. 4B, the word line decoder 122 is coupled to the word line WL0. The word lines 460, 461 connected to the gates of memory cells are shorted to one another. The word lines WL0, WL1, WL2, and WL3, globally indicated with 460, are shorted to one another. A connecting line extends from the word line decoder 122 and branches to reach the word lines WL0, WL1, WL2, and WL3. When the connecting line is selected, the word lines WL0, WL1, WL2, and WL3 are selected simultaneously. Furthermore, the word line decoder 122 is coupled to the word line WL4. The word lines WL4, WL5, WL6, and WL7, globally indicated with 461, are shorted to one another. Another connecting line extends from the word line decoder and branches to reach the word lines WL4, WL5, WL6, and WL7. When another connecting line is selected, the word lines WL4, WL5, WL6, and WL7 are selected simultaneously.

The second sub-unit of the word-line decoder 250 is connected to the word-lines WL0 and WL4. Due to this structure shown in FIG. 4B, the word lines WL0, WL1, WL2, and WL3 have a same voltage level, and the word lines WL4, WL5, WL6, and WL7 also have a same voltage level. Therefore, all of the memory cells 410, 411, 412, 413 in a string 400 can be controlled synchronously. Same information can be stored in each memory cell of a string 400.

In another alternative embodiment, only some of the word lines of a string may be shorted to one another. For example, WL0, WL1, and WL2 are shorted to one another, and WL3 is left not shorted to any one of the word lines, but may be configured to conduct in any event (not drawn). In this case, data are stored in the memory cells corresponding to the shorted word-lines, while the memory cell corresponding to the not shorted word line WL3 is left as a redundant cell which always conducts. The disclosure also includes this alternative embodiment.

More than one cell in a string may be controlled synchronously. For programming operation, same gate voltage is applied to the memory cells of the string 400, which then stores same bit information. The erase operation is still performed by a block basis. Redundancy information and/or configuration information may be stored in the extra memory array 220.

By shortening and grouping more than one word line, the DST and SST need not to be controlled independently by the second sub unit of the word line decoder 250. In particular the DST and SST may be configured to be synchronized with the other memory cells inside the extra memory array 230. Alternatively, the DST and SST may be configured to conduct regardless of the voltage applied to the word-lines WL0 to WL3. In another embodiment, the manufacturing process may be chosen not to form the selector lines DSL, SSL and the selector cells (transistors) DST, SST from the beginning.

Another advantage of this alternative embodiment is that even though a memory cell has an error or a portion of a word line is disconnected, the data may be stored and read more safely since there are redundant memory cells and word line operating synchronously. Moreover, during the power up phase when the operating voltage applied to the memory cell is not stable, it is not guaranteed that the operating voltage remains constant.

Next, by grouping or short-circuiting the wordlines as explained here in FIG. 4B, and also by grouping or short-circuiting the bitlines and the wordlines as explained below in FIG. 5A, the probability that one or more cells being failed cause a reading fail, is highly reduced, since the cells are simultaneously read.

Hereinafter, an exemplary reading operation will be explained to show the advantageous effect of error correction according to the another embodiment of FIG. 4B.

In first example, bit '0' is stored in the four memory cells 455. The four memory cells 455 include the memory cells which are connected to bit line BL1 and word lines WL0, WL1, WL2, and WL3. The four memory cells 455 forms a group, and this one group stores one bit according to the embodiment.

The bit '0' indicates that the memory cell is programmed to store electrons in the gate. When a memory cell is programmed, even if a bias voltage is applied to the gate of that memory cell through word line, the memory cell does not conduct.

In the following <table 1>, two different cases are written to show how the error is corrected when a bit '0' is stored in a group of memory cells.

TABLE 1

| Case | First case | Second case |
| --- | --- | --- |
| Written Data in all of the memory cells | 0 | 0 |
| Cell on BL1 and WL0 | 0: No error | *1: Error* |
| Cell on BL1 and WL1 | 0: No error | 0: No error |
| Cell on BL1 and WL2 | 0: No error | 0: No error |
| Cell on BL1 and WL3 | 0: No error | 0: No error |
| Result of read by sense circuit | 0: No error | 0: No error. |

*The result is repaired.

In the first case, all memory cells 455 operates correctly, so the data stored in the memory cells 455 reads correctly as '0'.

In the second case, an error occurs at the cell on BL1 and WL0, and the cell on BL1 and WL0 conducts. However, since the rest cells, i.e. cell on BL1 and WL1, cell on BL1 and WL2, and cell on BL1 and WL3 work correctly and the cells have a NAND configuration, both ends of the memory cells 455 do not conduct regardless of the error of the cell on BL1 and WL0. Then, the final result read by the sense circuit is '0' which is the same as the data bit stored in the group of the memory cells 455. Therefore, the data is repaired to a correct one in spite of the malfunction of one memory cell in the second case.

In the following <table 2>, two different cases are written to show how the error is corrected when a bit '1' is stored in a group of memory cells.

The four memory cells 455 include the memory cells which are connected to bit line BL1 and word lines WL0, WL1, WL2, and WL3. The four memory cells 455 forms a group, and this one group stores one bit.

The bit '1' indicates that the memory cell is erased and the gate of the memory cell does not store any electron therein. After a memory cell is erased, if a bias voltage is applied to the gate of that memory cell through word line, the memory cell conducts.

TABLE 2

| Case | First case | Second case |
| --- | --- | --- |
| Written Data in all of the memory cells | 1 | 1 |
| Cell on BL1 and WL0 | 1: No error | *0: Error* |
| Cell on BL1 and WL1 | 1: No error | 1: No error |
| Cell on BL1 and WL2 | 1: No error | 1: No error |
| Cell on BL1 and WL3 | 1: No error | 1: No error |
| Result of read | 1: No error | 0: Error. |

*The result is NOT repaired.

In the first case, all memory cells 455 operates correctly, so the data stored in the memory cells 455 reads correctly as '1'.

In the second case, an error occurs at the cell on BL1 and WL0, and the cell on BL1 and WL0 does not conduct. Although the rest cells, i.e. cell on BL1 and WL1, cell on BL1 and WL2, and cell on BL1 and WL3 work correctly, because the cells have a NAND configuration, both ends of the memory cells 455 does not conduct regardless of the correct operation of the rest cells. Then, the final result read by the sense circuit is '0' which is different from the data bit '1' stored in the group of the memory cells 455. Therefore, the data is not repaired in the second case.

As shown in the above two examples, the exact data can be restored by short-circuiting word-lines where there is a read error in one of the memory cells grouped together. This means that due to one pair of the shorted word lines, it is accomplished to repair the error indicating logic value"1" (i.e. to be the correct logic value "0"), and that alternatively, due to one pair of the shorted bit lines, it is accomplished to repair the error indicating logic value "0" (i.e. to be the correct logic value "1"). Besides, due to both pairs of the shorted word lines and bit lines, both can be accomplished, as will be explained below.

Figure 5A:
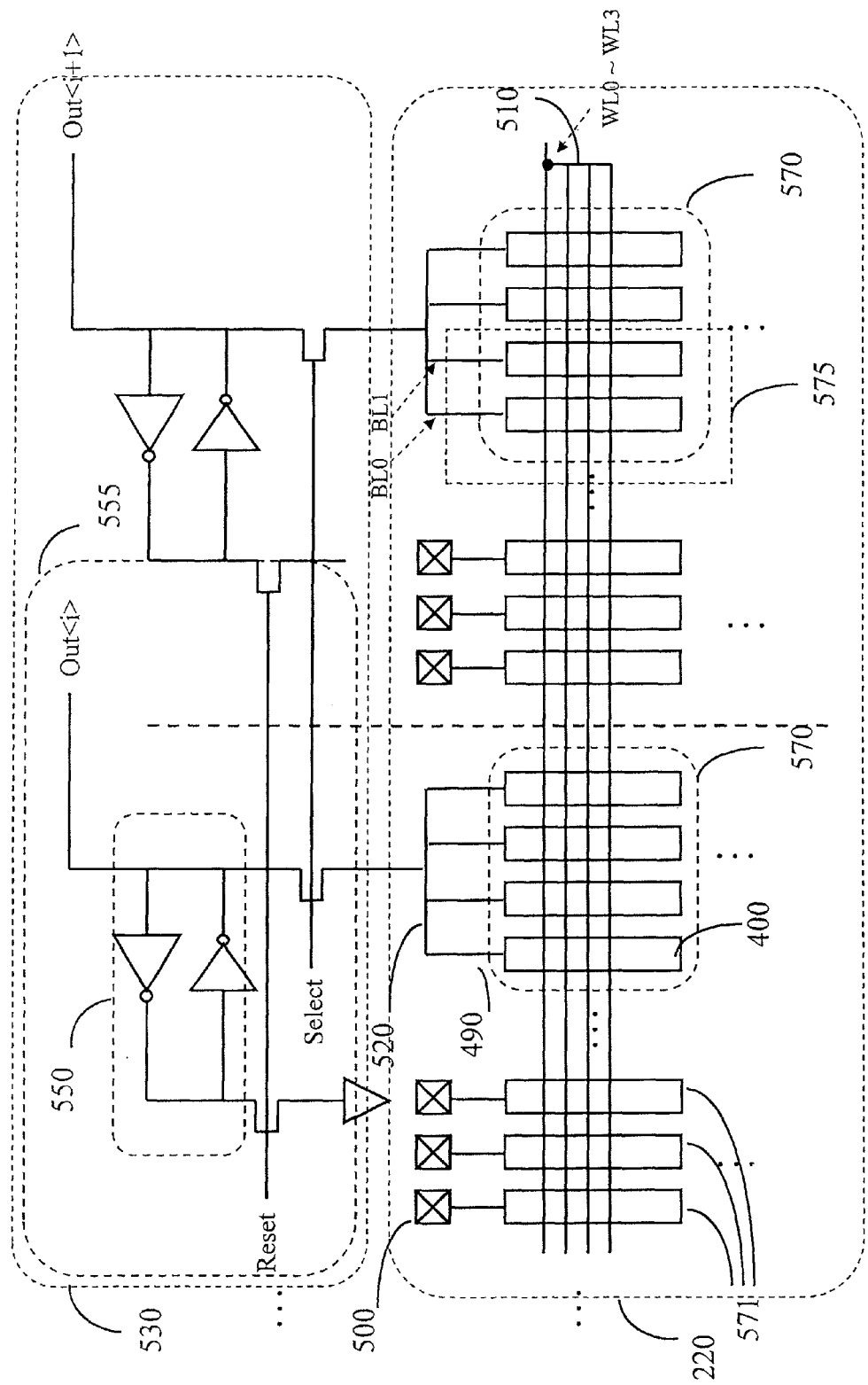
FIG. 5A schematically shows a detailed structure of the architecture of the sensing circuit according to still another embodiment of the invention.

FIG. 5A schematically shows a detailed structure of sensing circuit according to still another embodiment of the invention.

The sensing circuit 530 comprises at least one sensing unit 555 comprising at least one latch 550 for reading and storing information of a group of memory cells in the extra memory array 220. A select transistor is coupled between one end of the latch 550 and a first node, and comprises source-drain path between one end of the latch 550 and the first node and a gate to which a select signal is supplied. A reset transistor is coupled between the other end of the latch 550 and a ground potential, and comprises source-drain path between the other end and the ground potential and a gate to which a reset signal is supplied. A sensing line extended from the first node of the select transistor and branches to reach the bit lines 520 of strings 570.

The bit lines 520 are shorted to each other and coupled with sensing unit 555 (i.e. a connection line extends from the latch of the sensing unit and branches to reach the bit lines 520). The sensing unit 555 comprises a latch 550 to store data read from the memory cells. The other strings 571 except the above strings 570 may be connected to an array well 500, which are not connected to any sensing circuit. A plurality of this kind of blocks can be disposed horizontally as seen in the figure.

The word-lines 510 are shorted to each other and coupled with the word line decoder as seen for the previous embodiment (i.e. another connection line extends from the word line decoder and branches to reach the word lines 510).

In an exemplary configuration, if we suppose that the extra memory array has 33920 bit-lines, the 33920 bit-lines may be grouped by 16, so as to have 2120 bits being available to redundancy and configuration purposes. In case a high number of bits is needed, the bit-lines could be grouped by 8, so as to have 4240 bits available which is double of the former configuration. However, in the latter case, few cells are simultaneously read and thus the reading error probability becomes higher.

Hereinafter, an exemplary reading operation will be explained to show the advantageous effect of error correction according to the still another embodiment of FIG. 5A.

In first example, a bit '0' is stored in the eight memory cells 575. The eight memory cells 455 include the memory cells which are connected to bit line BL1, BL0 and word lines WL0, WL1, WL2, and WL3. The eight memory cells 575 forms a group, and this one group stores one bit according to the embodiment. In FIG. 5A, it is drawn that sixteen memory cells form a group, but for brevity of explanation it is assumed that eight cells form a group.

The bit '0' indicates that the memory cell is programmed to store an electron in the gate. When a memory cell is programmed, even if a bias voltage is applied to the gate of that memory cell through word line, the memory cell does not conduct.

In the following <table 3>, two different cases are written to show how the error is corrected when a bit '0' is stored in a group of memory cells.

TABLE 3

| Case | First case | | Second case | |
|---|---|---|---|---|
| Written Data in all of the memory cells | 0 | | 0 | |
| WL0 | Cell on BL0: 0: No error | Cell on BL1: 0: No error | *Cell on BL0: 1: Error* | Cell on BL1: 0: No error |
| WL1 | Cell on BL0: 0: No error | Cell on BL1: 0: No error | Cell on BL0: 0: No error | Cell on BL1: 0: No error |
| WL2 | Cell on BL0: 0: No error | Cell on BL1: 0: No error | Cell on BL0: 0: No error | Cell on BL1: 0: No error |
| WL3 | Cell on BL0: 0: No error | Cell on BL1: 0: No error | Cell on BL0: 0: No error | Cell on BL1: 0: No error |
| Result of read | 0: No error | | 0: No error. | |

*The result is repaired.

In the first case, all memory cells 575 operates correctly, so the data stored in the memory cells 575 reads correctly as '0'.

In the second case, an error occurs at the cell on BL0 and WL0, and the cell on BL0 and WL0 conducts. However, since the rest cells, i.e. cell on BL0 and WL1, cell on BL0 and WL2, cell on BL0 and WL3, cell on BL1 and WL0, cell on BL1 and WL1, cell on BL1 and WL2, and cell BL1 and WL3 work correctly and the cells have a NAND configuration in each string, both ends of the memory cells 575 do not conduct regardless of the error of the cell on BL0 and WL0. Then, the final result read by the sense circuit is '0' which is the same as the data bit stored in the group of the memory cells 575. Therefore, the data is repaired to a correct one in spite of the malfunction of one memory cell in the second case. Besides, even if two errors at the cells on BL0 and WL0 and on BL1 and WL0 occur, the data can be read correctly without an error.

In the following <table 4>, two different cases are written to show how the error is corrected when a bit '1' is stored in a group of memory cells.

In second example, a bit '1' is stored in the eight memory cells 575 in FIG. 5A. The eight memory cells 575 include the memory cells which are connected to bit line BL1, BL0 and word lines WL0, WL1, WL2, and WL3. The eight memory cells 575 forms a group, and this one group stores one bit according to the embodiment. In FIG. 5A, it is drawn that sixteen memory cells form a group, but for brevity of explanation it is assumed that eight cells form a group.

The bit '1' indicates that the memory cell is erased and the gate of the memory cell does not store any electron therein. After a memory cell is erased, if a bias voltage is applied to the gate of that memory cell through word line, the memory cell conducts.

TABLE 4

| Case | First Case | | Second Case | |
|---|---|---|---|---|
| Written Data in all of the memory cells | 1 | | 1 | |
| WL0 | Cell on BL0: 1: No error | Cell on BL1: 1: No error | *Cell on BL0: 0: Error* | Cell on BL1: 1: No error |
| WL1 | Cell on BL0: 1: No error | Cell on BL1: 1: No error | Cell on BL0: 1: No error | Cell on BL1: 1: No error |
| WL2 | Cell on BL0: 1: No error | Cell on BL1: 1: No error | Cell on BL0: 1: No error | Cell on BL1: 1: No error |
| WL3 | Cell on BL0: 1: No error | Cell on BL1: 1: No error | Cell on BL0: 1: No error | Cell on BL1: 1: No error |
| Result of read | 1: No error | | 1: No error. | |

*The result is repaired.

In the first case, all memory cells 575 operates correctly, so the data stored in the memory cells 575 reads correctly as '1'.

In the second case, an error occurs at the cell on BL0 and WL0, and the cell on BL0 and WL0 does not conduct. Although the rest cells, i.e. cell on BL0 and WL1, cell on BL0 and WL2, and cell on BL0 and WL3 work correctly, because the cells have a NAND configuration, both ends of the memory cells connected to BL0 do not conduct regardless of the correct operation of the rest cells. Thus, current does not flow thorough the bitline BL0.

However, since all of the memory cells connected to the other bitline BL1 work correctly, and the ends of the bitlines BL0 and BL1 are shorted to each other, the sensing circuit can detect current which comes from BL1. Thus, the sensing circuit can determine that the memory cells 575 are storing bit '1' even thought there is an error in one of the cells.

In the following <table 5>, third example are shown when each cell of different bit-line works incorrectly.

TABLE 5

| | | |
|---|---|---|
| Written Data in all of the memory cells | 1 | |
| WL0 | *Cell on BL0: 0: Error* | *Cell on BL1: 0: Error* |
| WL1 | Cell on BL0: 1: No error | Cell on BL1: 1: No error |
| WL2 | Cell on BL0: 1: No error | Cell on BL1: 1: No error |
| WL3 | Cell on BL0: 1: No error | Cell on BL1: 1: No error |
| Result of read | 0: Error | |

*The result is NOT repaired.

In this case, the cell on BL0 and WL0 does not conduct to make current not flow through the BL0, and the cell on BL1 and WL0 does not conduct to make current not flow through the BL1. Thus, no current flow through the bitlines BL0 and BL1 for the sensing circuit not to detect any current. Then, the sensing circuit determines that bit '0' is stored in the group of memory cells 575, which is incorrect. In this case, the error was not corrected, being however provided that a further bit line is shorted additionally to the BL0 and BL1, the error which has not been corrected in the table 5 can be repaired, and the data can be read correctly without an error. Depending on increasing a number of bit lines and/or word lines which are shorted, the probability of repairing an error can become higher, and thus the higher reliability of reading correctly data without an error is obtained.

As shown in the above examples, the exact data can be restored by short-circuiting word-lines when there is a read error in one of the memory cells grouped together.

Figure 5B:
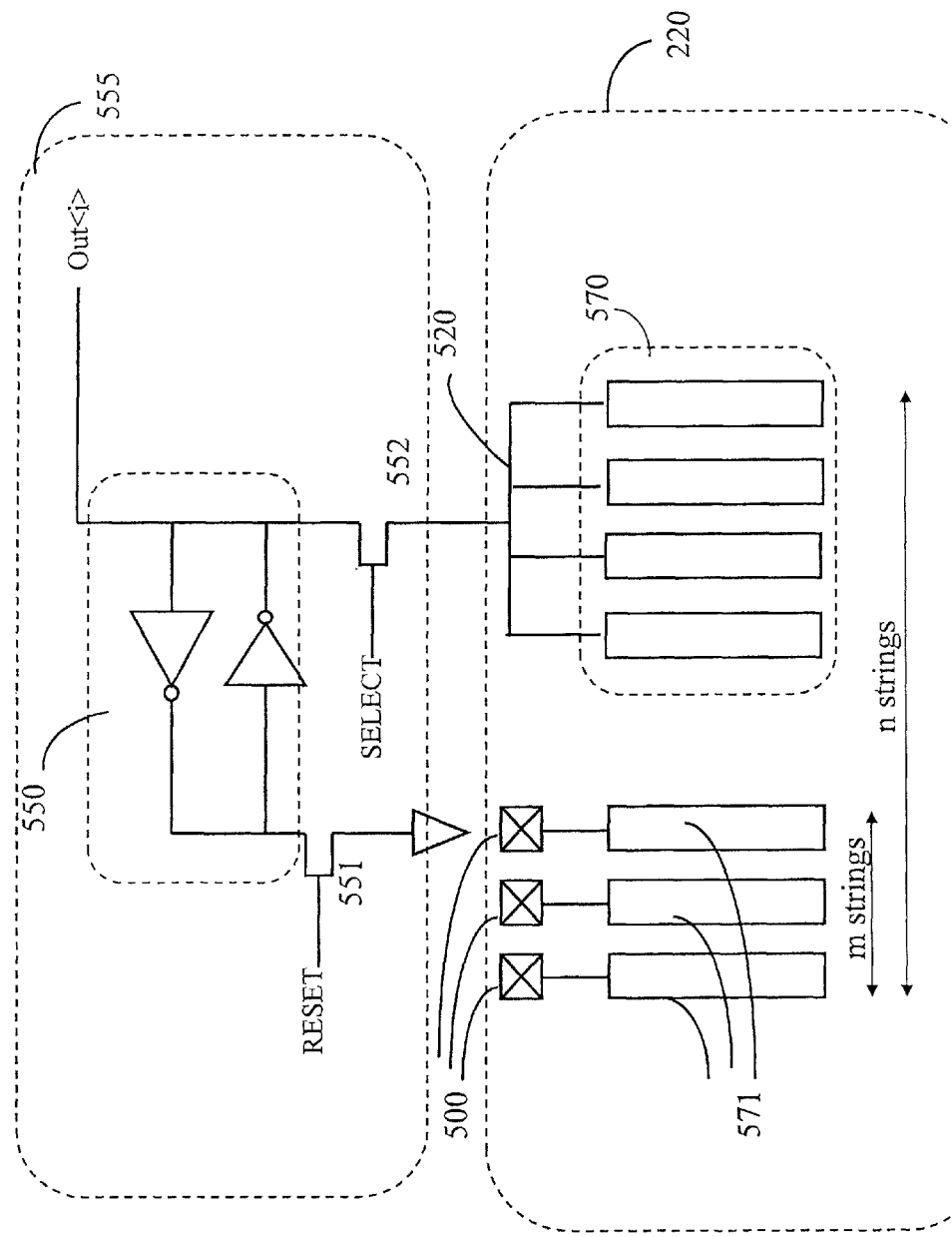
FIG. 5B schematically shows a detailed structure of a sensing unit of the sensing circuit of the still another embodiment shown in FIG. 5A.

FIG. 5B schematically shows a detailed structure of one sensing unit 555 of the sensing circuit 530 of FIG. 5A.

The sensing unit 555 comprises a latch 550 to read and store data read from the memory cells in the shorted strings 570. The sensing unit 555 comprises a "select" transistor 552 which is operated to read data from the shorted strings 570. The sensing unit 555 comprises a "reset" switch 551 to reset data stored in the latch 550 to be ready for reading a new data from the extra memory array 220.

In the embodiment, horizontally arranged n strings 570 may be grouped together. In other word, n strings in a same row may be grouped together. The latch 550 may be designed, for example, to have the pitch of n strings, where n depends on the manufacturing process being used to realize the memory device.

In the embodiment, the read operation by sensing circuit 555 is done by measuring current flowing through the bit lines. For example, if a memory cell in a string 570 is selected by a bias voltage applied by word line, and the gate of the memory cell do not trap an electron inside, the drain and source is conducted by the bias voltage applied by the word line. In this way, the current flows through the grouped strings 570 and the latch 550 is switched.

In particular, the maximum number of strings to be grouped, cannot be lower than the minimum number of strings needed to drain a current being sufficient to invert the latch in all working conditions, while it cannot be higher than the number of strings needed to store the required data (bit).

Since more than one bit lines are shorted each other, even though there are some error in a string among the plurality of strings 570, the probability of read fail decreases. During the power up phase, the operating voltage applied to the memory cell may fluctuate, i.e. it is not guaranteed that the operating voltage remains constant. In short, one of the purposes of shorting the strings 570 is to reduce the read fail. That is, even if a string has some fail cells the other strings grouped together will drain enough current to switch the latch 550.

According to the embodiment, the not grouped strings 571 are connected to the array well 500 to minimize the coupling effect between each group of n-m strings 570 connected to the latches 550. The array well 500 is usually connected to ground. However, it may be biased at high voltage during erase phase.

Moreover, being the word-lines of the cells of each string and the bit lines shorted and driven together, the n strings act as a single cell. In this way, possible defects in the extra memory array 270 can be masked. In another alternative embodiment, some of the not grouped strings may be not coupled with the array well 500 nor to the sensing unit 555.

Figure 6:
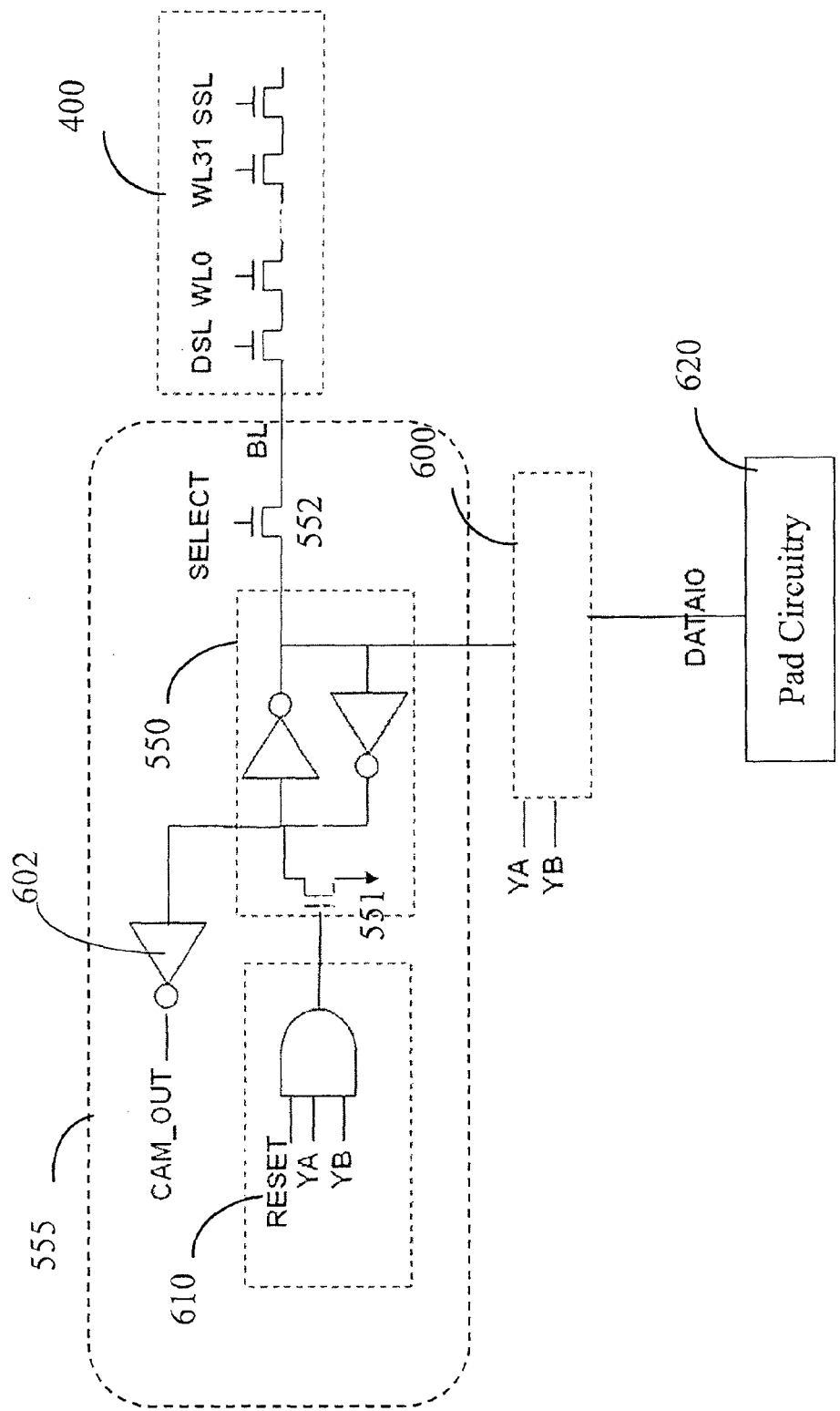
FIG. 6 schematically shows the sensing circuit of FIG. 5A with the decoding structure.

FIG. 6 schematically shows a decoding circuitry of the sensing circuit according to another aspect of the embodiment.

The sensing element 555 may be coupled with a string 400. As explained before, more than one bit-lines extended from other strings may be shorted together to reduce read failure during the power-up phase. In the embodiment, the string 400 includes 32 memory cells associated with the signals of the word lines WL0, WL1, . . . , WL31 serially connected. The drain select line DSL and source select line SSL are positioned at both sides of the memory cells to switch this string 400. As mentioned before, a number of word-lines may be shorted to one another to form a group and operate synchronously.

A bit-line BL is connected to a select transistor 552 and the latch 550 is connected to the reset switch 551. The select transistor 552 may control whether the sensing unit 555 conduct with the memory array 400 or not based on a SELECT signal value. When the select transistor 552 is closed, if enough currents flow through the bit-line BL, the latch 550 switches and outputs a signal CAM_OUT through an inverter 602. If the select transistor 552 is open, again based on the SELECT signal, the latch 550 maintains the data which it received and keeps the output CAM_OUT constant. Then, if the reset switch 551 conducts, the voltage stored in the latch 550 is leaked out. The reset switch 551 can be controlled by, for example, a reset decoding logic 610 which receives the signals RESET and the decoding signal YA, YB. Moreover, the signal CAM_OUT is an internal signal that is used by the digital part.

A signal DATAIO is connected to the pad circuitry (620) and is used to bring the information outside the device for testing purpose. A decoding circuit 600 may be needed for this purpose based on a specific design for the implementation.

Referring to FIGS. 3, 5 and 6, the method for reading and writing the data in the extra memory array will be explained briefly.

To read the data stored in the memory cells of the extra memory array, a control signal and address signal for reading information stored in the extra memory array may be provided to a dedicated to the second sub-unit of the word line decoder 250. Then, the dedicated world line decoder 250 decodes the signal and determines which word-line should receive a bias voltage. As an exemplary way, not limiting the scope of invention, a bias voltage just above the threshold voltage of a MOS transistor realizing the memory cells of the extra memory array may be applied to the word line.

Then, the sensing unit 550 in the sensing circuit 535 detects the flow of current. In other words, if a current flows out from the memory cells in the string 400 or the group of strings 570, the latch 550 is switched on. Otherwise, the latch 550 is not switched on. Either way, the latch 550 may store single bit information.

To erase data stored in the memory cells of the extra memory array, an appropriate control and address signal for erasing the configuration information may be provided to the dedicated word line decoder of the extra memory array. Then, the dedicated word-line decoder may decode the control and address signal, and provide a suitable erasing voltage.

In essence, according to the embodiments of the invention, a separate storing of redundancy and configuration information in a NAND type Flash memory is provided.

In particular, an extra array of cell is added to the main array, the extra memory array being separated from the main one and having its own sensing circuitry. The sensing circuitry may be also used to maintain the information read till the memory device is power up. It should be remarked that the proposed solution is more reliable and more area efficient respect to the prior art solutions.

More in particular, by using of an extra memory array of cells separated from the main memory array with its own sensing circuitry make the reading of the extra memory array reliable.

Moreover, being the strings grouped (the bit lines and word lines being shorted) the problems tied to a single failed string are overcome. The grouping of the strings also simplifies the reading of the same, being performed by a simple inverting of the latch.

Advantageously according to the embodiments, the testing of the so obtained memory device is simplified (also the final test). In fact, during a testing step, the configurations information may be changed while the redundancy ones are kept unchanged with a great time saving, being due to the word lines cut.

According to the embodiments, it is possible integrate such a latch in the area of the grouped strings, which act as a single cell. Also, by using a dedicated latch for reading the cam information, that latch can be used to store read data, the added sensing circuit not needing to read the memory matrix. Moreover, the added sensing circuitry does not need to use drain and gate selectors.

Finally, a NAND memory device according to the described embodiments does not need to use appropriate algorithms to eliminate error in the reading during the power on being the redundancy date duly provided.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. A semiconductor device comprising:
   a first decoder circuit including a plurality of first output nodes and producing a plurality of first decoded voltages at the first output nodes, respectively;
   a second decoder including a plurality of second output nodes and producing a plurality of second decoded voltages at the second output nodes, respectively;
   a plurality of first terminals coupled to the first output nodes to receive the first decoded voltages, respectively, the first terminals being arranged in line in a first direction;
   a plurality of second terminals coupled to the second output nodes to receive the second decoded voltages, respectively, the second terminals being arranged in line in the first direction;
   a plurality of first word lines each extending from an associated one of the first terminals in a second direction toward to the second terminals and terminating between the first and second terminals, the second direction being substantially perpendicular to the first direction;
   a plurality of second word lines each extending from an associated one of the second terminals in a third direction toward to the first terminals and terminating near to an end of an associated one of the first word lines, the third direction being opposite to the second direction, each of the second word lines being substantially aligned with an associated one of the first word lines;
   a plurality of first bit lines each arranged to intersect with the first word lines;
   a plurality of second bit lines each arranged to intersect with the second word lines;
   a plurality of first memory cell strings and a plurality of second memory cell strings, each of the first memory cell strings being coupled to an associated one of the first bit lines and including a plurality of memory cells coupled in series and connected to the first word lines, respectively, and each of the second memory cell strings being coupled to an associated one of the second bit lines and including a plurality of memory cells coupled in series and connected to the second word lines, respectively; and
   a first sensing unit and a memory cell array which are disposed to sandwich the first and second word lines, the first and second bit lines and the first and second memory cell strings therebetween,
   wherein the memory cell array comprises a plurality of third word lines provided separately from the first and second word lines and extending in substantially parallel to the first and second word lines, a plurality of third bit lines provided separately from the first and second bit lines and intersecting with the third word lines, and a plurality of third memory cell strings, each of the third memory cell strings being coupled to an associated one of the third bit lines and including a plurality of memory cells coupled in series and connected to the third word lines, respectively.

2. The semiconductor device as claimed in claim 1, wherein the first and second decoder circuits are disposed to sandwich the first and second terminals, the first and second word lines and the first and second bit lines therebetween.

3. The semiconductor device as claimed in claim 1, wherein the first sensing unit comprises a first sensing circuit coupled to the first bit lines and a second sensing circuit coupled to the second bit lines.

4. The semiconductor device as claimed in claim 1, further comprising a second sensing unit that is disposed to cooperate with the first sensing unit to sandwich the first and second word lines, the first and second bit lines, the first and second memory cell strings and the memory cell array therebetween.

5. A device comprising:
   a first array comprising a plurality of cells;
   a plurality of word lines each coupled to an associated one of the cells; and
   a row decoder circuit configured to drive the word lines,
   wherein each of the word lines is structured by first and second portions that are separated from each other, and
   wherein redundant information is stored corresponding to one of the first and second portions of the word line, and configuration information is stored corresponding to the other of the first and second portions of the word line.

6. The device as claimed in claim 5, further comprising:
   a plurality of bit lines;
   a sensing circuit; and
   a sensing line extending from the sensing circuit and branching to reach ones of the bit lines.

7. The device as claimed in claim 5, wherein each of the word lines is structured by first and second portions that are separated from each other, the first portion of the word line being coupled to one or ones of the cells of the first memory array, and the second portion of the word line being coupled to remaining one or ones of the cells of the first memory array.

8. The device as claimed in claim 6, further comprising:
   a second array comprising a plurality of memory cells;
   and wherein each of the bit lines is structured by first and second portions that are separated from each other, the first portion of the bit line being coupled to the cells of the first memory array, and the second portion of the bit line being coupled to the cells of the second memory array.

9. The device as claimed in claim 8, wherein the first and second arrays are configured in a NAND type.

10. A device comprising:
    a first array including a plurality of first memory cells, a plurality of second memory cells, and first, second, third and fourth selector cells, the first memory cells being coupled between the first and second selector cells, and the second memory cells being coupled between the third and fourth selector cells;

a first selection line coupled in common to gates of the first and third selector cells;

a second selection line coupled in common to gates of the second and fourth selector cells;

a plurality of word lines each coupled in common to a gate of an associated one of the first memory cells and a gate of an associated one of the second memory cells;

a plurality of bit lines;

a select transistor having a first node; and a first line extending from the first node of the select transistor and branching to reach first and second ones of the bit lines, such that when the first line is selected, the first and second ones of the bit lines are selected;

the first selector cell being coupled to the first node via the first bit line without a transistor intervening between the first selector cell and the first node via the first bit line; and the third selector cell being coupled to the first node via the second bit line without a transistor intervening between the third selector cell and the first node via the second bit line.

11. The device as claimed in claim 10, further comprising:

a latch coupled between second and third nodes, the select transistor having source-drain path between the first node and the second node; and a reset transistor having source-drain path between the third node and a ground potential.

12. The device as claimed in claim 11, further comprising:

a reset decoding logic coupled to a gate of the reset transistor;

a latch decoding circuit coupled between the second node of the latch and a data IO pad; and a CAM output circuit including an inverter coupled to the third node of the latch of the sensing circuit.

13. The device as claimed in claim 10, further comprising a semiconductor well coupled to one or ones of the bit lines.

14. The device as claimed in claim 10, further comprising:

a second array including a plurality of cells, and wherein each of the bit lines is structured by first and second portions that are separated from each other, the first portion of the bit line being coupled to the cells of the first memory array, and the second portion of the bit line being coupled to the cells of the second memory array.

15. The device as claimed in claim 14, wherein redundant information is stored in the first memory array independently of being stored in the second memory array.

16. The device as claimed in claim 14, further comprising:

a page buffer configured to access the second memory array and not to access the first memory array.

17. The device as claimed in claim 14, wherein the first and second arrays are configured in a NAND type.

18. The device as claimed in claim 1, wherein first one of the output nodes of the first decoder is coupled in common to ones of the first terminals, such that when the first one of the output nodes of the first decoder is selected, the ones of the first terminals are selected.

19. The device as claimed in claim 18, wherein second one of the output nodes of the first decoder is coupled in common to other ones of the first terminals, such that when the second one of the output nodes of the first decoder is selected, the other ones of the first terminals are selected.

20. The device as claimed in claim 18, further comprising:

a selection transistor having a first node coupled in common to ones of the first bit lines, such that when the first node is selected, the ones of the first bit lines are selected.

21. The device as claimed in claim 1, further comprising:

a selection transistor having a first node coupled in common to ones of the first bit lines, such that when the first node is selected, the ones of the first bit lines are selected.

22. The device as claimed in claim 10, further comprises:

a row decoder circuit; and a row connecting line extending from the row decoder circuit and branching to reach first and second ones of the word lines, such that when the row connecting line is selected, the first and second ones of the word lines are selected.

23. The device as claimed in claim 5, further comprising:

a row connecting line extending from the row decoder circuit and branching to reach ones of the word lines of the first memory array, such that when the row connecting line is selected, the ones of the word lines are selected.

24. The device as claimed in claim 5, wherein the redundant information includes address information used for substituting a failed memory cell, and wherein the configuration information includes parameter information used for a working of a circuit.

25. The device as claimed in claim 10, further comprising:

a source line coupled in common to the second selector cell and the fourth selector cell, the second selector cell being coupled between the source line and an associated one of the first memory cells, and the fourth selector cell being coupled between the source line and an associated one of the second memory cells.

* * * * *